(12) United States Patent
Hsin

(10) Patent No.: US 9,608,052 B2
(45) Date of Patent: Mar. 28, 2017

(54) SUB-PIXEL ARRANGEMENT, METHOD FOR REPAIRING THE SAME, DISPLAY PANEL AND DISPLAY DEVICE

(71) Applicant: BOE TECHNOLOGY GROUP CO., LTD., Beijing (CN)

(72) Inventor: Lungpao Hsin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/083,764

(22) Filed: Mar. 29, 2016

(65) Prior Publication Data

US 2017/0062543 A1  Mar. 2, 2017

(30) Foreign Application Priority Data

Aug. 25, 2015 (CN) .......................... 2015 1 0524992

(51) Int. Cl.
*H01L 27/12* (2006.01)
*H01L 27/32* (2006.01)
*H01L 51/05* (2006.01)
*H01L 51/10* (2006.01)
*H01L 51/56* (2006.01)

(52) U.S. Cl.
CPC ........ *H01L 27/3274* (2013.01); *H01L 27/124* (2013.01); *H01L 27/32* (2013.01); *H01L 27/3246* (2013.01); *H01L 27/3258* (2013.01); *H01L 27/3262* (2013.01); *H01L 51/0545* (2013.01); *H01L 51/107* (2013.01); *H01L 51/56* (2013.01); *H01L 2251/568* (2013.01)

(58) Field of Classification Search
CPC ...... H01L 21/70; H01L 21/702; H01L 27/281
See application file for complete search history.

(56) References Cited

U.S. PATENT DOCUMENTS

2011/0216261 A1* 9/2011 Han .................. G02F 1/134336
349/42

\* cited by examiner

*Primary Examiner* — Cheung Lee
(74) *Attorney, Agent, or Firm* — Harness, Dickey & Pierce, P.L.C.

(57) ABSTRACT

The present disclosure provides a sub-pixel arrangement including: a first sub-pixel region, a second sub-pixel region, and a connection region. Each electrode arranged in the sub-pixel and configured to implement display control may be connected to a source/drain electrode of the TFT through a via hole within the connection region, so as to cut an electrode material within the via hole to disconnect the electrode from the source/drain electrode when a pixel is to be repaired. The sub-pixel arrangement may facilitate to improve the success rate of repairing the display panels and improve the yield rate of the display panels.

20 Claims, 3 Drawing Sheets

SUB-PIXEL ARRANGEMENT, METHOD FOR REPAIRING THE SAME, DISPLAY PANEL AND DISPLAY DEVICE

CROSS REFERENCE OF RELATED APPLICATION

The present application claims the priority of Chinese patent application No. 201510524992.2 filed on Aug. 25, 2015, the disclosure of which is incorporated herein by reference in its entirety.

TECHNICAL FIELD

The present disclosure relates to the technical field of displaying, in particular to a sub-pixel arrangement, a method for repairing the sub-pixel arrangement, a display panel and a display device.

BACKGROUND

Due to the fact that an Organic Light-Emitting diode (OLED) is driven by current, each pixel in an Active Matrix Organic Light Emitting Diode (AMOLED) display screen is originally designed to include a plurality of Thin Film Transistors (TFTs) and a plurality of capacitors. In addition, it is commenced to arrange top-emitting pixels in high-end products nowadays to satisfy a requirement of high aperture ratio.

During a process of manufacturing a display panel, there are a variety of conditions that may cause some pixel units in the display panel to be damaged, such as defect and flashing, so that display quality of the display panel deteriorates.

Conventionally, such damaged pixel units may be repaired by a laser beam to improve a yield rate of display panels.

In the related art, the repair is implemented by breaking control lines of the damaged pixel unit such as a data line or a gate line by the laser beam, namely the damaged pixel unit is disconnected from the control lines, so that the damaged pixel unit is powered off and in a state of not displaying. However, such repair method may lead to that a whole row or column of pixel units including the damaged pixel unit are in the state of not displaying, and apparently the display quality of the display panel cannot be improved by such repair method, which is not conducive to improving the yield rate of display panels. In addition, the display panel may even be further damaged by such repair method because it is possible that undamaged wire lines in the display panel are adversely affected by the metal filings generated and spattered during the process of repairing.

SUMMARY

An object of the present disclosure is to provide a sub-pixel arrangement, a method for repairing the sub-pixel arrangement, a display panel and a display device, so as to improve a success rate of repairing the display panels and improve the yield rate of the display panels.

The solutions of the present disclosure are as follows.

In one aspect, the present disclosure provides in some embodiment a sub-pixel arrangement including: at least one TFT, a first sub-pixel region, a second sub-pixel region, and a connection region, wherein each electrode arranged in the sub-pixel and configured to implement display control is connected to a source/drain electrode of the TFT through a via hole within the connection region, so as to cut an electrode material within the via hole to disconnect the electrode configured to implement the display control from the source/drain electrode when a pixel is to be repaired.

Alternatively, in each of the first sub-pixel region and the second sub-pixel region, the sub-pixel arrangement may further include:

an anode layer;
an electroluminescent layer formed on the anode layer;
a cathode layer formed on the electroluminescent layer; and
the anode layer is connected to the source/drain electrode through the via hole.

Alternatively, the sub-pixel arrangement may further include:

a pixel definition layer configured to define the first sub-pixel region and the second sub-pixel region.

Alternatively, the sub-pixel arrangement may further include:

a gate electrode layer formed on a base substrate;
a gate insulation layer formed on the gate electrode layer;
an organic semiconductor layer formed on the gate insulation layer;
a source/drain electrode layer formed on the gate insulation layer and the organic semiconductor layer; and
a protection layer formed on the source/drain electrode layer.

Alternatively, the electrode configured to implement the display control in the sub-pixel may be connected to the source/drain electrode layer through a via hole formed in the protection layer.

Alternatively, the pixel definition layer may be formed on the protection layer.

Alternatively, the protection layer may include:

a passivation layer formed on the source/drain electrode layer; and
a resin layer formed on the passivation layer.

In another aspect, the present disclosure provides in some embodiment a method for repairing a pixel, including a step of:

cutting an electrode material formed within a via hole by a laser beam having a corresponding wavelength based on a structure of a sub-pixel arrangement, so as to disconnect each electrode from a source/drain electrode of a thin film transistor (TFT) of the sub-pixel arrangement, wherein each electrode is arranged in the sub-pixel arrangement and configured to implement display control, and the via hole is arranged within a connection region of the sub-pixel arrangement.

Alternatively, the method may further include:

cutting a layer material formed within the connection region from a top of a source/drain metal layer or an electrode layer by the laser beam having the corresponding wavelength, when the source/drain metal layer or the electrode layer is formed within the sub-pixel arrangement; or cutting a layer material formed within the connection region on a base substrate of the sub-pixel arrangement from a bottom of the base substrate by the laser beam having the corresponding wavelength, when a pixel definition layer is formed within the sub-pixel arrangement.

In yet another aspect, the present disclosure provides in some embodiments a display panel including a plurality of the above sub-pixel arrangements arranged in a pre-defined sequence.

In yet another aspect, the present disclosure provides in some embodiments a display device including the above display panel.

It can be seen from above that, regarding the sub-pixel arrangement, the method for repairing the sub-pixel arrangement, the display panel and the display device, the sub-pixel arrangement includes: a first sub-pixel region, a second sub-pixel region, and a connection region, wherein each electrode arranged in the sub-pixel and configured to implement display control is connected to a source/drain electrode of the TFT through a via hole within the connection region, so as to cut an electrode material within the via hole to disconnect the electrode configured to implement the display control from the source/drain electrode when a pixel is to be repaired. The above sub-pixel arrangement may facilitate to improve the success rate of repairing the display panels and improve the yield rate of the display panels.

BRIEF DESCRIPTION OF THE DRAWINGS

In order to illustrate the technical solutions of the present disclosure or the related art in a clearer manner, the drawings desired for the embodiments or the related art will be described briefly hereinafter. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiment a sub-pixel arrangement including at least one TFT for turning on/off a pixel.

Figure 1:
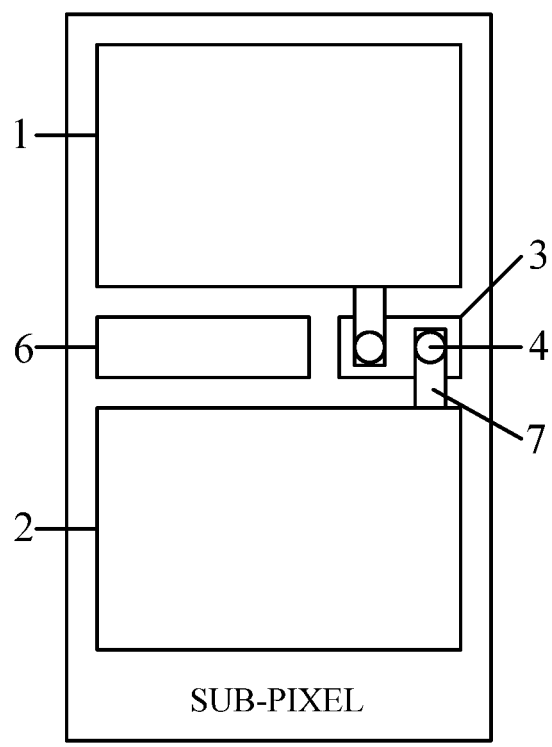
FIG. 1 is a first schematic view showing a sub-pixel arrangement according to an embodiment of the present disclosure.
Figure 2:
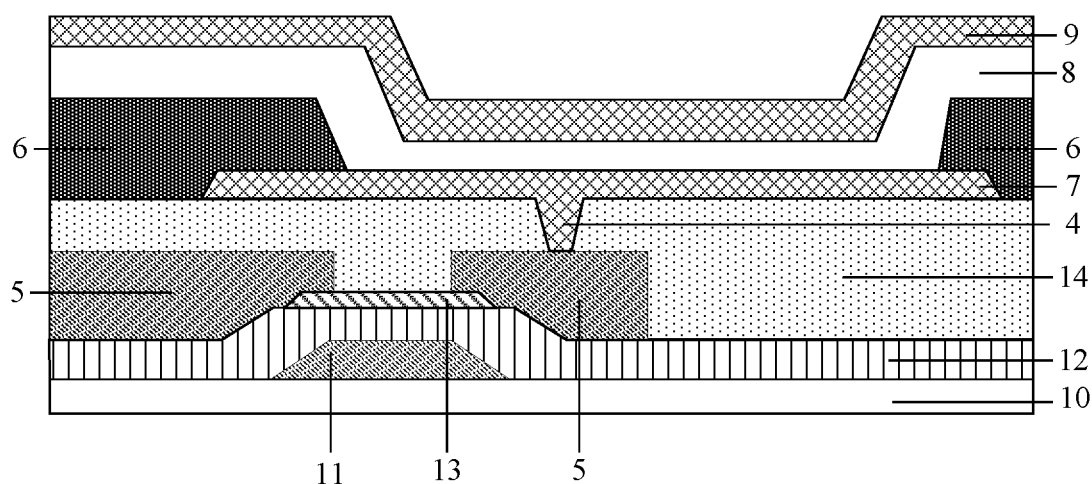
FIG. 2 is a second schematic view showing a sub-pixel arrangement according to an embodiment of the present disclosure.

As illustrated in FIG. 1 and FIG. 2, the sub-pixel arrangement includes: a first sub-pixel region 1, a second sub-pixel region 2, and a connection region 3.

As illustrated in FIG. 1 and FIG. 2, each electrode arranged in the sub-pixel and configured to implement display control is connected to a source/drain electrode 5 of the TFT through a via hole 4 within the connection region 3, so as to cut an electrode material within the via hole 4 to disconnect the electrode from the source/drain electrode 5 when a pixel is to be repaired.

In this sub-pixel arrangement, a sub-pixel is divided into two (or more) portions. Different sub-pixels in each sub-pixel arrangement may display a same primary color or display different primary colors respectively. In addition, each electrode arranged in the sub-pixel and configured to implement display control is connected to a source/drain electrode 5 of the TFT through a via hole 4 within the connection region 3 particularly designed. As a result, when a sub-pixel displays abnormally, i.e. the sub-pixel is damaged, the sub-pixel may be repaired by the laser beam to cut the electrode material of the sub-pixel within the via hole 4 to disconnect the electrode from the source/drain electrode 5 of the TFT, so that the sub-pixel is in the state of not displaying, and the display quality is prevented from deterioration caused by the damaged sub-pixel. Meanwhile, the operation of the undamaged sub-pixel is not affected adversely.

Furthermore, in this embodiment of the present disclosure, during the period of repairing the sub-pixel by breaking the electrode material in the via hole, it may be generated and sputtered metal filings, which is shielded by side wall of the via hole (i.e. another layer), so that it is prevented the undamaged wire lines from being adversely affected by the metal filings.

Furthermore, in this embodiment of the present disclosure, the power of the light ray for the repair (for example, the laser beam) may be controlled based on the arrangement of current layers (i.e. the existing layers) of the sub-pixel arrangement, so as to minimize the metal filings being generated and spattered. For example, the power of the laser beam may be controlled by controlling a wavelength of the laser beam.

In other words, in the embodiments of the present disclosure, the sub-pixel arrangement is provided to improve the success rate of repairing the display panels and improve the yield rate of the display panels.

In the sub-pixel arrangement, a Pixel Definition Layer (PDL) 6 may be arranged to define the first sub-pixel region and the second sub-pixel region, so as to define each of the sub-pixel regions. In other words, the PDL 6 is arranged between neighboring sub-pixels, as illustrated in FIG. 1 and FIG. 2.

As illustrated in FIG. 2, in each of the sub-pixel regions, the sub-pixel arrangement may further include:

an anode layer 7;

an electroluminescent layer 8 formed on the anode layer 7; and a cathode layer 9 formed on the electroluminescent layer 8.

The sub-pixel arrangement may be applied in an AMO-LED display panel or another type of display panel. The present disclosure is not limited thereto.

It can be seen from FIG. 2 that the anode layer 7 is connected to the source/drain electrode 5 through the via hole 4. Thus, during the repair, the material of the portion of the anode 7 formed in the via hole 4 to disconnect the anode 7 from the source/drain electrode 5, so that the anode 7 and the source/drain electrode 5 are in a state of not being connected to each other.

As further illustrated in FIG. 2, the sub-pixel arrangement further includes:

a gate electrode layer 11 formed on a base substrate 10;

a gate insulation layer 12 formed on the gate electrode layer 11;

an organic semiconductor layer 13 formed on the gate insulation layer 12;

a source/drain electrode layer 5 formed on the gate insulation layer 12 and the organic semiconductor layer 13; and a protection layer 14 formed on the source/drain electrode layer 5.

The TFT of the sub-pixel consists of the above component layers.

In this embodiment, there may be only one TFT, and the electrodes of the sub-pixels are connected to the source/drain electrode 5 of the TFT. In another embodiment, there may be a plurality of TFTs which are in a one-to-one correspondence to the sub-pixels (i.e. the number of the TFTs corresponds to the number of the sub-pixels), and the electrodes of the sub-pixels are connected to the source/drain electrodes 5 of the corresponding TFTs through via holes 4 respectively. Thus, the undamaged sub-pixels are not affected by the repair operation.

The TFT consisting of the above component layers may be arranged within an area of the connection region 3.

It can be seen from FIG. 2 that the via hole 4 may be arranged in the protection layer 14. As a result, in the sub-pixel, the electrode arranged in the sub-pixel and configured to implement display control is connected to the source/drain electrode 5 through the via hole 4 formed in the protection layer 14.

Furthermore, in this embodiment of the present disclosure, the pixel definition layer 6 may be arranged on the protection layer 14.

Furthermore, in this embodiment of the present disclosure, the protection layer 14 may consist of at least one of the passivation layer and the resin layer.

Figure 3:
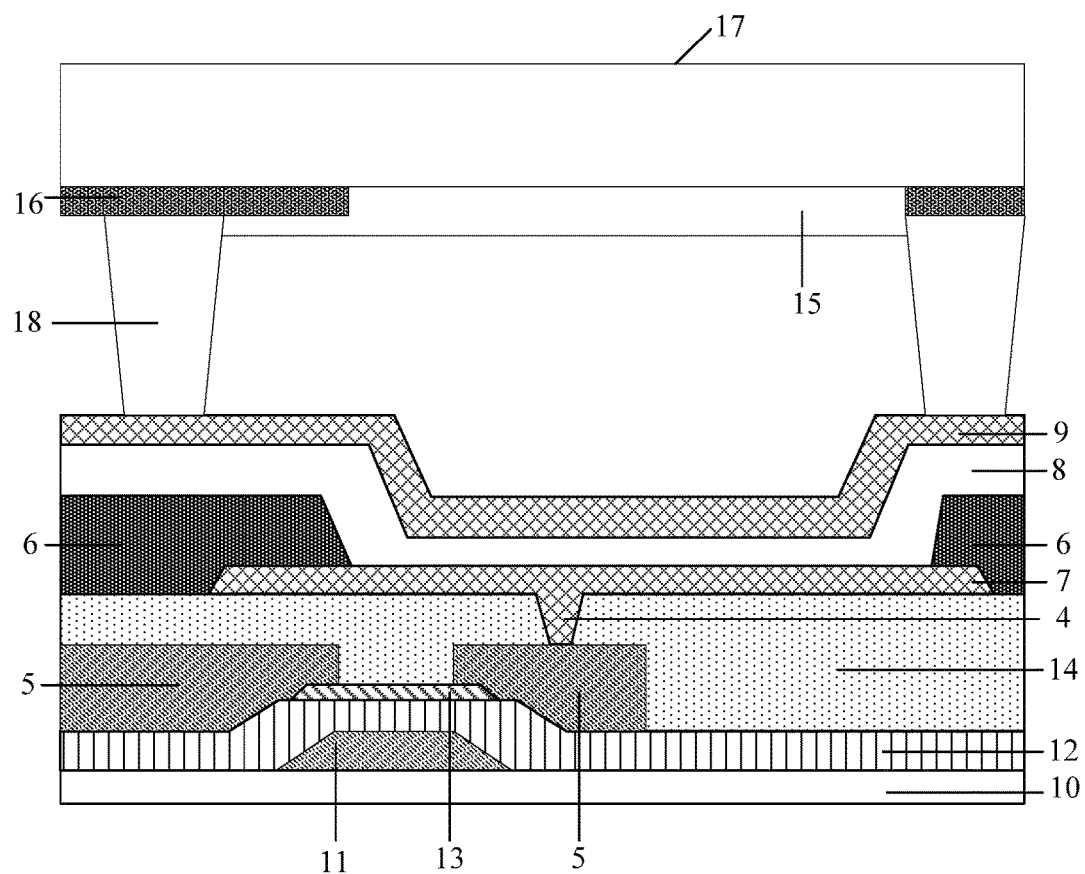
FIG. 3 is a third schematic view showing a sub-pixel arrangement according to an embodiment of the present disclosure.

Furthermore, in this embodiment of the present disclosure, as illustrated in FIG. 3, other portions such as a color filter substrate 15, a black matrix 16, a color filter 17 and separators 18 may be arranged at a position of the sub-pixel arrangement within the display panel.

The sub-pixel arrangement as illustrated in FIGS. 1-3 is merely an example of the sub-pixel arrangements according to the present disclosure, and the present disclosure is not limited thereto.

In another aspect, the present disclosure provides in some embodiment a method for repairing a pixel, including a step of:

cutting an electrode material formed within a via hole 4 by a laser beam having a corresponding wavelength based on a structure of a sub-pixel arrangement, so as to disconnect each electrode from a source/drain electrode 5 of a thin film transistor (TFT) of the sub-pixel arrangement, wherein each electrode is arranged in the sub-pixel arrangement and configured to implement display control, and the via hole 4 is arranged within a connection region 3 of the sub-pixel arrangement.

In the above method, the power of the laser beam for the repair operation may be controlled based on the arrangement of current layers of the sub-pixel arrangement, so as to minimize the metal filings being generated and spattered. Furthermore, in this embodiment of the present disclosure, during the period of repairing the sub-pixel by breaking the electrode material in the via hole, the metal filings being generated and sputtered may be shielded by side wall of the via hole (i.e. another layer), so that it is prevented the undamaged wire lines from being adversely affected by the metal filings.

In other words, in the solutions of the present disclosure, the power of the laser beam may be controlled by controlling the wavelength of the laser beam, so that the power of the laser beam corresponds to a height of the side wall of the via hole on a premise of being capable of cutting the electrode material, the height of the side wall may be determined by characteristics of the layers where the via hole is arranged, such as the number of the layers and a thickness of the layers. As a result, the metal filings being generated and sputtered during the period of cutting the electrode material in the via hole 4 by the laser beam may be shielded by the side wall of the via hole, so that it is prevented the undamaged wire lines from being adversely affected by the metal filings. Therefore, the feature "by a laser beam having a corresponding wavelength based on a structure of a sub-pixel arrangement" in the method of the embodiment of the present disclosure is explained as above.

During the process of manufacturing the sub-pixel arrangement, it is possible that one or more component layers are damaged, so that the display panel displays abnormally. Thus, the above method for repairing the pixel may be applied to repair the component layers.

Figure 4:
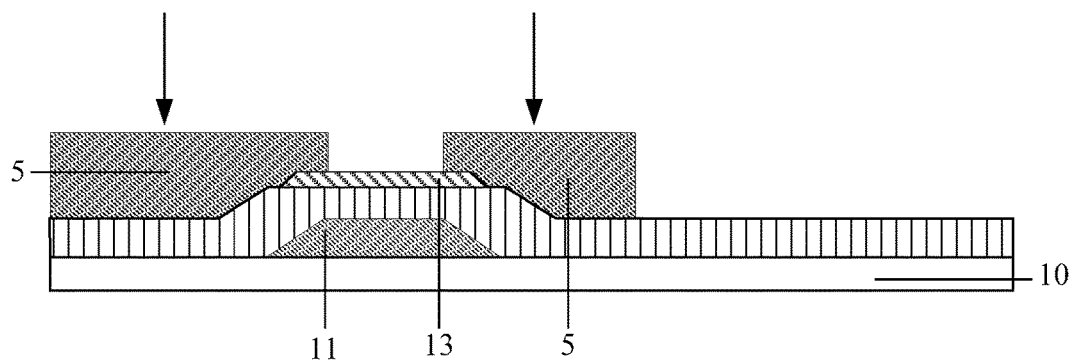
FIG. 4 is a first schematic view for implementing a method for repairing a pixel according to an embodiment of the present disclosure.

For example, as illustrated in FIG. 4, when the source/drain metal layer (i.e. the source/drain electrode 5) is formed in the sub-pixel arrangement, an layer material formed within the connection region 3 (for example, the source/drain electrode 5, and the gate electrode layer 11) may be cut by the laser beam having the corresponding wavelength (for example, the laser beam having the corresponding wavelength of 320-490 nm) from the top of the source/drain electrode 5, so as to repair the sub-pixel arrangement.

Figure 5:
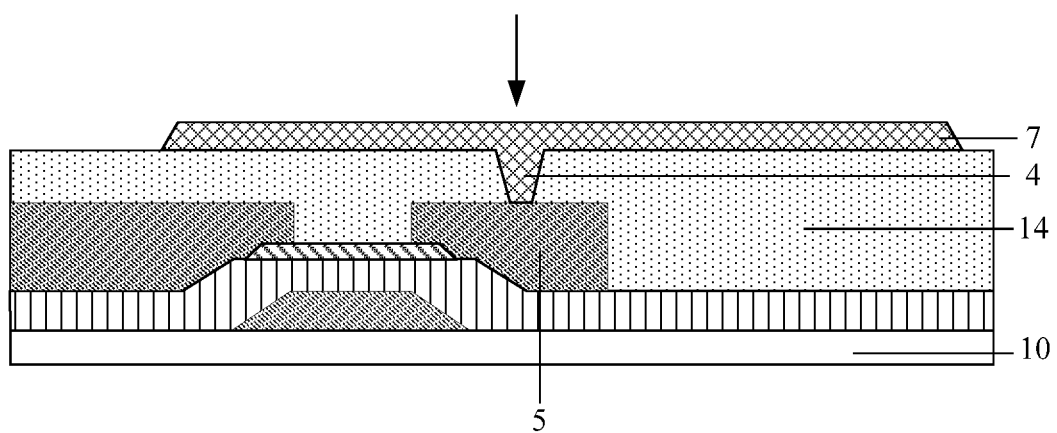
FIG. 5 is a second schematic view for implementing a method for repairing a pixel according to an embodiment of the present disclosure.

In another embodiment, as illustrated in FIG. 5, when the anode 7 layer is formed in the sub-pixel arrangement, the layer material formed within the connection region 3 (for example, the anode 7, and the source/drain electrode 5) may be cut by the laser beam having the corresponding wavelength from the top of the anode 7, so as to repair the sub-pixel arrangement.

Figure 6:
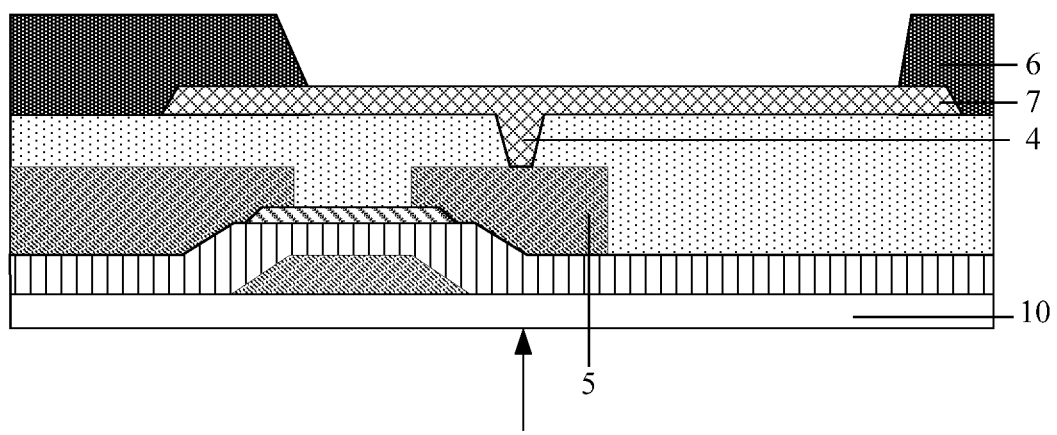
FIG. 6 is a third schematic view for implementing a method for repairing a pixel according to an embodiment of the present disclosure.

When the pixel definition layer 6 is formed in the sub-pixel arrangement, since the pixel definition layer 6 is made of a material which is not transmissible by a light ray having short wavelength (for example, the transmissibility of the light ray having the wavelength of being less than 500 nm is less than 30%, wherein the pixel definition layer is made of resin and dyes) to protect the TFT from an affection of a high-energy light ray, the pixel definition layer 6 may shield the laser beam because the laser beam is the high-energy light ray having the wavelength of being less than 500 nm, and thus the repair may be adversely affected. Therefore, the layer material within the connection region 3 (for example, the source/drain electrode 5, the anode 7) may be cut by the laser having the corresponding wavelength from the bottom of the base substrate 10, so as to repair the sub-pixel arrangement, as shown in FIG. 6.

In yet another aspect, the present disclosure provides in some embodiments a display panel including a plurality of the above sub-pixel arrangements arranged in a pre-defined sequence.

In yet another aspect, the present disclosure provides in some embodiments a display device including the above display panel.

The optional embodiments of the present disclosure have been discussed. It is appreciated that many modifications and substitutions may be made to the present disclosure without departing from the principle of the present disclosure for those skilled in the art. These modifications and substitutions should also be deemed to be fallen within the scope of the present disclosure.

What is claimed is:

1. A sub-pixel arrangement, comprising:
   at least one thin film transistor (TFT);
   a first sub-pixel region and a second sub-pixel region; and
   a connection region,
   wherein each electrode arranged in the sub-pixel and configured to implement display control is connected to a source/drain electrode of the TFT through a via hole within the connection region, so as to cut an electrode material within the via hole to disconnect the electrode configured to implement the display control from the source/drain electrode when a pixel is to be repaired.

2. The sub-pixel arrangement according to claim 1, wherein in each of the first sub-pixel region and the second sub-pixel region, the sub-pixel arrangement further comprises:
   an anode layer;
   an electroluminescent layer formed on the anode layer; and
   a cathode layer formed on the electroluminescent layer, wherein the anode layer is connected to the source/drain electrode through the via hole.

3. The sub-pixel arrangement according to claim 2, further comprising:
   a pixel definition layer configured to define the first sub-pixel region and the second sub-pixel region.

4. The sub-pixel arrangement according to claim 1, further comprising:
   a pixel definition layer configured to define the first sub-pixel region and the second sub-pixel region.

5. The sub-pixel arrangement according to claim 4, further comprising:
   a gate electrode layer formed on a base substrate;
   a gate insulation layer formed on the gate electrode layer;
   an organic semiconductor layer formed on the gate insulation layer;
   a source/drain electrode layer formed on the gate insulation layer and the organic semiconductor layer; and
   a protection layer formed on the source/drain electrode layer.

6. The sub-pixel arrangement according to claim 5, wherein the electrode configured to implement the display control in the sub-pixel is connected to the source/drain electrode layer through a via hole formed in the protection layer.

7. The sub-pixel arrangement according to claim 5, wherein the pixel definition layer is formed on the protection layer.

8. The sub-pixel arrangement according to claim 5, wherein the protection layer comprises:
   a passivation layer formed on the source/drain electrode layer; and
   a resin layer formed on the passivation layer.

9. A method for repairing a pixel, comprising a step of:
   cutting an electrode material formed within a via hole by a laser beam having a corresponding wavelength based on a structure of a sub-pixel arrangement, so as to disconnect each electrode from a source/drain electrode of a thin film transistor (TFT) of the sub-pixel arrangement, wherein each electrode is arranged in the sub-pixel arrangement and configured to implement display control, and the via hole is arranged within a connection region of the sub-pixel arrangement.

10. The method according to claim 9, further comprising:
    cutting a layer material formed within the connection region from a top of a source/drain metal layer or an electrode layer by the laser beam having the corresponding wavelength, when the source/drain metal layer or the electrode layer is formed within the sub-pixel arrangement.

11. The method according to claim 9, further comprising:
    cutting a layer material formed within the connection region on a base substrate of the sub-pixel arrangement from a bottom of the base substrate by the laser beam having the corresponding wavelength, when a pixel definition layer is formed within the sub-pixel arrangement.

12. A display panel, comprising a plurality of sub-pixel arrangements arranged in a pre-defined sequence, wherein each of the sub-pixel arrangements comprises:
    at least one thin film transistor (TFT);
    a first sub-pixel region and a second sub-pixel region; and
    a connection region,
    wherein each electrode arranged in the sub-pixel and configured to implement display control is connected to a source/drain electrode of the TFT through a via hole within the connection region, so as to cut an electrode material within the via hole to disconnect the electrode configured to implement the display control from the source/drain electrode when a pixel is to be repaired.

13. The display panel according to claim 12, wherein in each of the first sub-pixel region and the second sub-pixel region, the sub-pixel arrangements each further comprises:
    an anode layer;
    an electroluminescent layer formed on the anode layer; and
    a cathode layer formed on the electroluminescent layer, wherein the anode layer is connected to the source/drain electrode through the via hole.

14. The display panel according to claim 13, the sub-pixel arrangements each further comprises:
    a pixel definition layer configured to define the first sub-pixel region and the second sub-pixel region.

15. The display panel according to claim 12, wherein the sub-pixel arrangements each further comprises:
    a pixel definition layer configured to define the first sub-pixel region and the second sub-pixel region.

16. The display panel according to claim 15, further comprising:
    a gate electrode layer formed on a base substrate;
    a gate insulation layer formed on the gate electrode layer;
    an organic semiconductor layer formed on the gate insulation layer;
    a source/drain electrode layer formed on the gate insulation layer and the organic semiconductor layer; and
    a protection layer formed on the source/drain electrode layer.

17. The display panel according to claim 16, wherein the electrode configured to implement the display control in the sub-pixel is connected to the source/drain electrode layer through a via hole formed in the protection layer.

18. The display panel according to claim 16, wherein the pixel definition layer is formed on the protection layer.

19. The display panel according to claim 16, wherein the protection layer comprises:
   a passivation layer formed on the source/drain electrode layer; and
   a resin layer formed on the passivation layer.

20. A display device comprising the display panel according to claim 12.

* * * * *